(12) United States Patent
Liu

(10) Patent No.: US 10,290,292 B2
(45) Date of Patent: May 14, 2019

(54) NOISE CONTROL METHOD AND DEVICE

(71) Applicant: Beijing Zhigu Rui Tuo Tech Co., Ltd., Beijing (CN)

(72) Inventor: Jia Liu, Beijing (CN)

(73) Assignee: BEIJING ZHIGU RUI TUO TECH CO., LTD., Beijing (CN)

( * ) Notice: Subject to any disclaimer, the term of this patent is extended or adjusted under 35 U.S.C. 154(b) by 0 days.

(21) Appl. No.: 15/117,172

(22) PCT Filed: Dec. 29, 2014

(86) PCT No.: PCT/CN2014/095276
§ 371 (c)(1),
(2) Date: Aug. 5, 2016

(87) PCT Pub. No.: WO2015/135363
PCT Pub. Date: Sep. 17, 2015

(65) Prior Publication Data
US 2016/0372099 A1    Dec. 22, 2016

(30) Foreign Application Priority Data

Mar. 10, 2014 (CN) .......................... 2014 1 0085428

(51) Int. Cl.
*H03G 3/32* (2006.01)
*H04N 5/60* (2006.01)
(Continued)

(52) U.S. Cl.
CPC ............... *G10K 11/16* (2013.01); *H03G 3/32* (2013.01); *H04N 5/60* (2013.01); *H04Q 9/00* (2013.01)

(58) Field of Classification Search
None
See application file for complete search history.

(56) References Cited

U.S. PATENT DOCUMENTS 5,666,426 A * 9/1997 Helms ...................... H03G 3/32
381/104
7,149,512 B2   12/2006 Connor
(Continued)

FOREIGN PATENT DOCUMENTS

CN       1747320 A    3/2006
CN       1897054 A    1/2007
(Continued)

OTHER PUBLICATIONS

International Search Report for PCT Application No. PCT/CN2014/095282, dated Apr. 3, 2015, 3 pages.
(Continued)

*Primary Examiner* — Curtis A Kuntz
*Assistant Examiner* — Kenny H Truong
(74) *Attorney, Agent, or Firm* — Amin, Turocy & Watson, LLP

(57) ABSTRACT

A noise control method and device are provided that relate to the field of noise control. A noise control method includes: acquiring noise information of an ambient environment; generating a noise control message including the noise information, the noise control message being used to notify other devices to adjust a volume; and sending the noise control message to the other devices. Another noise control method includes: receiving, by a device, a noise control message from an external device; judging, according to the noise control message, whether the device is necessary to perform volume adjustment; and adjusting a volume according to a volume adjustment policy if the device is necessary to perform volume adjustment. The noise control method and device in the embodiments of the present application easily and quickly realize control over ambient noise, thereby improving user experience.

47 Claims, 14 Drawing Sheets

(51) Int. Cl.
*H04Q 9/00* (2006.01)
*G10K 11/16* (2006.01)

(56) References Cited

U.S. PATENT DOCUMENTS

| | | | |
|---|---|---|---|
| 8,422,952 B2 | 4/2013 | Sato et al. | |
| 2003/0123680 A1 | 7/2003 | Lee et al. | |
| 2005/0282590 A1 | 12/2005 | Haparnas | |
| 2006/0177046 A1* | 8/2006 | Falcon | H04S 7/00 379/430 |
| 2007/0165834 A1* | 7/2007 | Redman | H04M 1/6041 379/395 |
| 2008/0085007 A1* | 4/2008 | Engelbrecht | H03G 3/32 381/57 |
| 2008/0089530 A1 | 4/2008 | Bostick et al. | |
| 2009/0046868 A1* | 2/2009 | Engle | H04R 1/1041 381/74 |
| 2010/0048131 A1* | 2/2010 | Hirsch | H04R 3/005 455/41.3 |
| 2011/0051016 A1* | 3/2011 | Malode | H03G 1/02 348/734 |
| 2011/0211712 A1 | 9/2011 | Yamada et al. | |
| 2011/0293113 A1 | 12/2011 | McCarthy | |
| 2012/0039489 A1 | 2/2012 | Chen et al. | |
| 2014/0079235 A1 | 3/2014 | Lyons | |
| 2014/0321680 A1* | 10/2014 | Takahashi | H04S 7/304 381/303 |
| 2015/0171813 A1 | 6/2015 | Ganatra | |

FOREIGN PATENT DOCUMENTS

| | | |
|---|---|---|
| CN | 101001274 A | 7/2007 |
| CN | 101079938 A | 11/2007 |
| CN | 101114818 A | 1/2008 |
| CN | 101562671 A | 10/2009 |
| CN | 102118665 A | 7/2011 |
| CN | 102158606 A | 8/2011 |
| CN | 102638602 A | 8/2012 |
| CN | 202383998 U | 8/2012 |
| CN | 102710838 A | 10/2012 |
| CN | 102761721 A | 10/2012 |
| CN | 102883121 A | 1/2013 |
| CN | 102915753 A | 2/2013 |
| CN | 103024630 A | 4/2013 |
| CN | 103138883 | 6/2013 |
| CN | 103138883 A | 6/2013 |
| CN | 103220600 A | 7/2013 |
| CN | 103383447 A | 11/2013 |
| CN | 103595849 A | 2/2014 |
| CN | 103634168 A | 3/2014 |
| CN | 103886731 A | 6/2014 |
| CN | 103886857 A | 6/2014 |
| CN | 103903606 A | 7/2014 |
| DE | 3220758 A1 | 12/1983 |
| JP | H04195000 A | 7/1992 |
| JP | H05211450 A | 8/1993 |
| JP | 2005295272 A | 10/2005 |
| JP | 2006270601 A | 10/2006 |
| JP | 2007142815 A | 6/2007 |
| JP | 2012039492 A | 2/2012 |
| WO | 0241489 A3 | 12/2002 |

OTHER PUBLICATIONS

International Search Report for PCT Application No. PCT/CN2014/095319, dated Mar. 27, 2015, 3 pages.
International Search Report for PCT Application No. PCT/CN2014/095276, dated Apr. 3, 2015, 3 pages.
Office Action for U.S. Appl. No. 15/117,166 dated Jun. 29, 2017, 52 pages.
Office Action for U.S. Appl. No. 15/117,182 dated Jun. 29, 2017, 37 pages.
Office Action for U.S. Appl. No. 15/865,491 dated Aug. 3, 2018, 33 pages.
Office Action for U.S. Appl. No. 15/880,598 dated Aug. 29, 2018, 39 pages.

* cited by examiner

NOISE CONTROL METHOD AND DEVICE

RELATED APPLICATION

The present international patent cooperative treaty (PCT) application claims the benefit of priority to Chinese Patent Application No. 201410085428.0, filed on Mar. 10, 2014, and entitled "Noise Control Method and Device", which is hereby incorporated into the present international PCT application by reference herein in its entirety.

TECHNICAL FIELD

The present application relates to the field of noise control technologies, and in particular, to a noise control method and device.

BACKGROUND

Noise pollution is a problem that people often encounter in everyday life. Generally, sounds that affect people's work, study and rest are called noise.

More and more electronic devices, while enriching people's everyday life, also bring about new noise pollution problems. For example, when a user is having a rest in the bedroom, perhaps other family members are watching TV in the living room, and at this time, if a sound that the TV set makes is too loud, the sound easily becomes noise, affecting the user's rest. For another example, when a user is listening to music through an audio system, at this time, the phone rings, and the user answers the phone and finds that the sound of the audio system is too loud, affecting the user's normal answering of the phone.

In the foregoing scenarios, the user often manually controls the volume key of the TV set or the audio system to adjust a volume, and then noise interference may be avoided, which has cumbersome steps and poor user experience.

SUMMARY

An example objective of the present application is to provide a noise control method and device.

In a first example aspect, an embodiment of the present application provides a noise control method, and the method includes:

acquiring noise information of an ambient environment;

generating a noise control message including the noise information, the noise control message being used to notify other devices to adjust a volume; and sending the noise control message to the other devices.

In a second example aspect, an embodiment of the present application provides a noise control method, and the method includes:

receiving, by a device, a noise control message from an external device;

judging, according to the noise control message, whether the device is necessary to perform volume adjustment; and adjusting a volume according to a volume adjustment policy if the device is necessary to perform volume adjustment.

In a third example aspect, an embodiment of the present application provides a noise controlling device, and the controlling device includes:

an acquisition module, configured to acquire noise information of an ambient environment;

a message generation module, configured to generate a noise control message including the noise information, the noise control message being used to notify other devices to adjust a volume; and a message sending module, configured to send the noise control message to the other devices.

In a fourth example aspect, an embodiment of the present application provides a noise controlled device, and the controlled device includes:

a receiving module, configured to receive a noise control message from an external device;

a first judgment module, configured to judge, according to the noise control message, whether it is necessary for the controlled device to perform volume adjustment; and an adjustment module, configured to adjust a volume according to a volume adjustment policy if the controlled device is necessary to perform volume adjustment.

Noise control methods and devices in the embodiments of the present application may easily and quickly realize control over ambient noise, thereby improving user experience.

DETAILED DESCRIPTION

Various embodiments of the present application are further described in detail hereinafter with reference to the accompanying drawings and embodiments. The following embodiments are intended to describe the present application, but not to limit the scope of the present application.

Those skilled in the art should understand that, in the embodiments of the present application, sequence numbers of steps do not mean an order of execution, and the order of execution of the steps should be determined according to functions and internal logic thereof, but should not pose any limitation to the implementation process of the implementations of the present application.

In addition, the terms such as "first" and "second" in the embodiments of the present application are merely used to distinguish different steps, devices or modules, which neither represent any specific technical meaning nor represent a necessary logical order between them.

The term "noise" in the present application refers to sounds that affect people's work, study and rest, which has relativity, for example, when a user makes a call, voices, music, whistles and the like around the user may become noise.

During research, the inventor has found that, before a user enters into a sound sensitive state, the user may often perform regular operations on a portable electronic device. For example, before going to bed, the user may adjust the mobile phone to a silent mode. For another example, before answering the phone, the user may press the answer key. Therefore, according to the user's operating habits, the corresponding electronic device (for example, a mobile phone) may previously know that the user will enter into a sound sensitive state, so as to notify surrounding electronic devices which are making a sound to reduce the volume in advance, thereby avoiding interference with the user.

Figure 1:
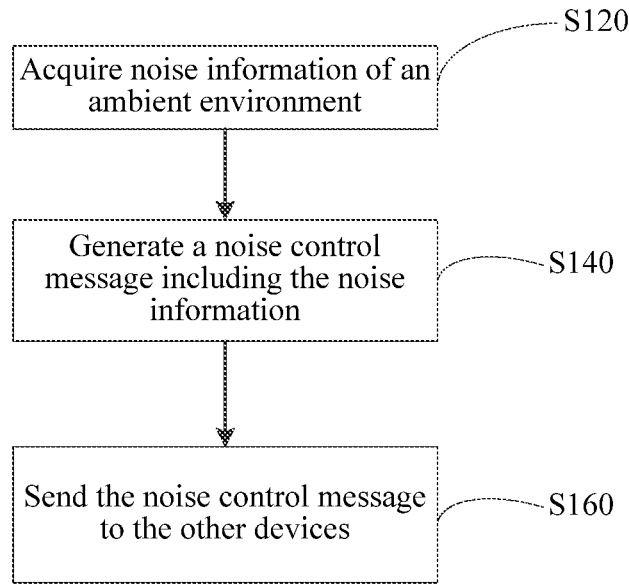
FIG. 1 is an example flowchart of a noise control method according to an embodiment of the present application.

FIG. 1 is a flowchart of a noise control method according to an embodiment of the present application; as shown in FIG. 1, the method may be realized in, for example, a noise controlling device, and the method includes:

S120: acquiring noise information of an ambient environment;

S140: generating a noise control message including the noise information, the noise control message being used to notify other devices to adjust a volume; and S160: sending the noise control message to the other devices.

According to the noise control method in the embodiment of the present application, noise information is acquired from noise in an ambient environment, a noise control message including the noise information is generated, and the noise control message is automatically sent to other devices, so as to notify the other devices to adjust a volume, thereby easily and quickly realizing control over ambient noise and improving user experience.

Functions of the steps S120, S140 and S160 are described below in detail.

In one example implementation, in the step S120, the noise information includes: a noise intensity value. The noise intensity value refers to information that may reflect intensity of noise in an ambient environment, for example, it may be a noise sound pressure level, a noise signal intensity, or the like.

In the present application, the adjusting the volume mainly means adjusting the volume from high to low; the present application does not define the specific adjustment manner, for example, the adjustment may be made by performing filtering on an output end, and the adjustment may also be made by modifying a volume value in an audio signal.

In an example implementation, the other devices that receive the noise control message may reduce their volume upon receipt of the noise control message, for example, each device reduces the volume by 10 dB each time. The implementation is mainly applicable to a situation where there are a small number of the other devices, for example, in the user's home, in addition to the mobile phone, only a TV set may produce noise impacts on the user. Through presetting, the TV set may automatically reduce the volume by 10 dB each time it receives the noise control message sent by the mobile phone. The reducing the volume in the present application includes reducing the volume to 0 dB, that is, the devices are shut down or muted.

In an example implementation, the other devices may be a plurality of separate sounding devices, and in the step S160, preferably, the noise control message is sent to the other devices through broadcasting. In this case, because the current volume of respective sounding devices and distances from the sounding devices to a sender of the noise control message are not completely the same, noise impacts caused by some sounding devices are great, while noise impacts caused by some sounding devices are small, it is not reasonable to let all sounding devices lower the volume by the same level, for example, some sounding devices have low volume and small noise impacts, and they may be muted after the volume is lowered, affecting normal use of other users. In this case, if corresponding information is transmitted to the other devices through the noise control message, the other devices may decide how much the volume is lowered according to their own situations, thereby further improving the user experience.

In an example implementation, the noise control message may include: the noise intensity value, and a transmit power value of the noise control message.

In an example implementation, the noise control message may include: the noise intensity value, and position information of a sender of the noise control message.

In an example implementation, the noise control message may include: the noise intensity value, noise sampling information and a corresponding sampling time. The noise sampling information and the sampling time may be acquired during acquisition of the noise information, that is to say, the noise information acquired from the noise of the ambient environment includes the noise sampling information and the sampling time. The noise sampling information may be an original noise sampling fragment or a processed noise sampling feature.

How the other devices use information included in the noise control message to adjust a volume will be described hereinafter, which is not repeated herein.

The noise information in the present application may be noise information corresponding to all collected sound frequencies. In addition, in another example implementation, the noise information may also be noise information of some specific sound frequency intervals, that is, noise information of at least one sound frequency interval. The implementation is mainly applicable to a situation where the user is relatively sensitive to noise in a specific sound frequency interval, for example, when the user is thinking, in terms of voices of character dialogues from a TV set and music from an audio system, the user may be more sensitive to the voices of dialogues. Therefore, the mobile phone of the user may acquire noise information of a sound frequency interval (for example, 300 HZ to 3400 HZ) corresponding to the voices of character dialogues from the noise of the ambient environment according to the user's habits, and then the steps S140 and S160 are executed.

Figure 2:
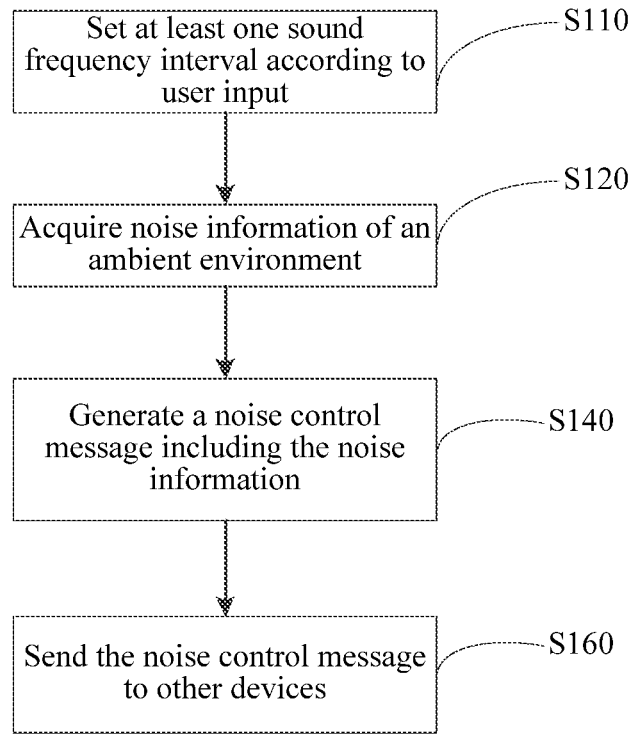
FIG. 2 is an example flowchart of a noise control method in an implementation according to an embodiment of the present application.

In addition, in another example implementation, the sound frequency interval may be set by the user; as shown in FIG. 2, the method may further include:

S110: setting at least one sound frequency interval according to user input.

In addition, the embodiments of the present application also provide a computer readable medium, comprising computer readable instructions which perform the following operations when being executed: executing the operations of steps S120, S140 and S160 of the method in the example implementation shown in FIG. 1.

To sum up, according to the noise control method in the example implementation, the noise control message may be automatically sent to other devices after acquisition of noise information of an ambient environment, and corresponding information may be transmitted through the noise control message, so that the other devices make out a volume adjustment policy according to their own situations, thereby simplifying noise control steps and improving user experience.

Figure 3:
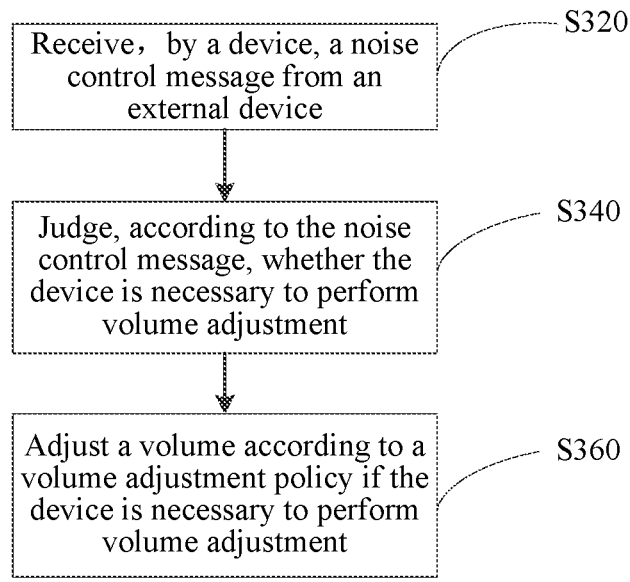
FIG. 3 is an example flowchart of a noise control method according to an embodiment of the present application.

FIG. 3 is a flowchart of a noise control method according to another embodiment of the present application; the method may be realized in, for example, a noise controlled device, as shown in FIG. 3, and the method includes:

S320: receiving, by a device, a noise control message from an external device;

S340: judging, according to the noise control message, whether the device is necessary to perform volume adjustment; and S360: adjusting a volume according to a volume adjustment policy if the device is necessary to perform volume adjustment.

The external device is maybe a mobile phone.

According to the method in this embodiment, a noise control message sent by an external device is received, whether it is necessary to perform volume adjustment is judged according to the noise control message, and a volume is adjusted according to a volume adjustment policy if it is necessary to perform volume adjustment, so that the volume may be adjusted automatically according to a request from the external device, thereby reducing noise output, simplifying noise control steps, and improving user experience.

Functions of the steps S320, S340 and S360 are described below in detail.

In an example implementation, in the step S320, the noise control message sent by the external device may be received wirelessly, so as to be convenient for the user to move the external device.

Figure 4:
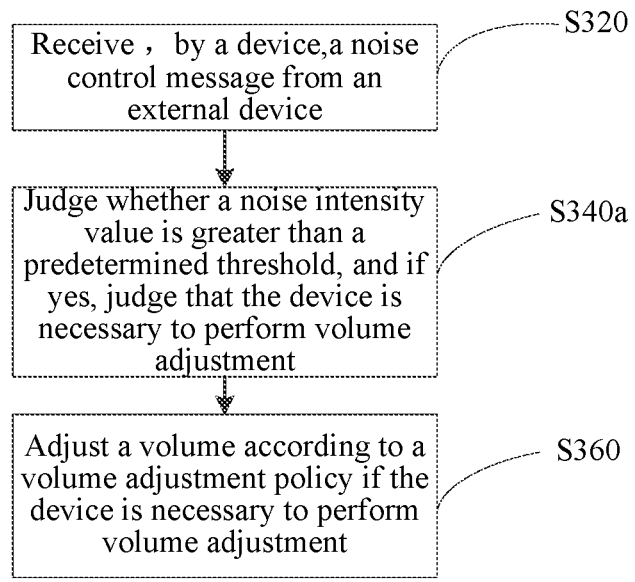
FIG. 4 is an example flowchart of a noise control method in an implementation according to an embodiment of the present application.

In an example implementation, the noise control message includes: a noise intensity value. Moreover, referring to FIG. 4, the step S340 includes:

S340a: judging whether the noise intensity value is greater than a predetermined threshold, and if yes, judging that the device is necessary to perform volume adjustment.

The predetermined threshold reflects the user's tolerability for the noise, for example, if the user hopes that the surrounding noise is less than or equal to 10 dB, the predetermined threshold may be set to 10 dB. The predetermined threshold may be set by the user during use, or may be set by a device manufacturer before delivery.

Figure 5:
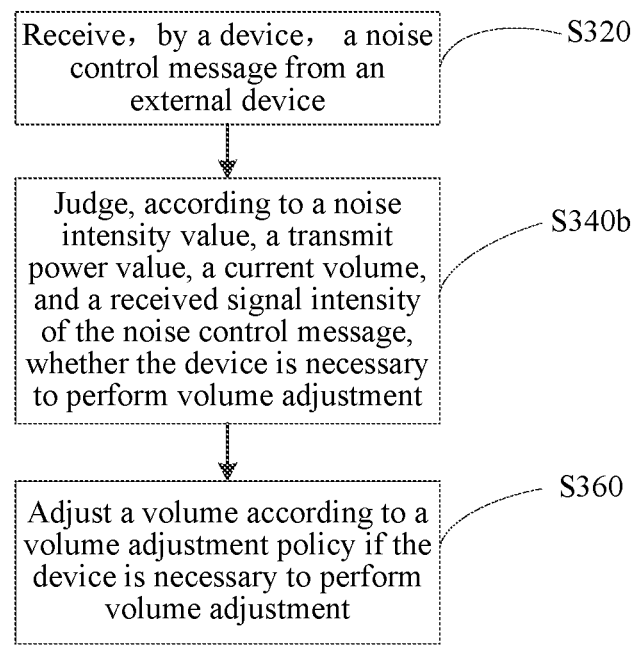
FIG. 5 is an example flowchart of a noise control method in an implementation according to an embodiment of the present application.

In an example implementation, the noise control message includes: a noise intensity value, and a transmit power value of the noise control message. Moreover, referring to FIG. 5, the step S340 includes:

S340b: judging, according to the noise intensity value, the transmit power value, a current volume, and a received signal intensity of the noise control message, whether it is necessary to perform volume adjustment.

In the present application, the current volume is the volume before volume adjustment.

Figure 6:
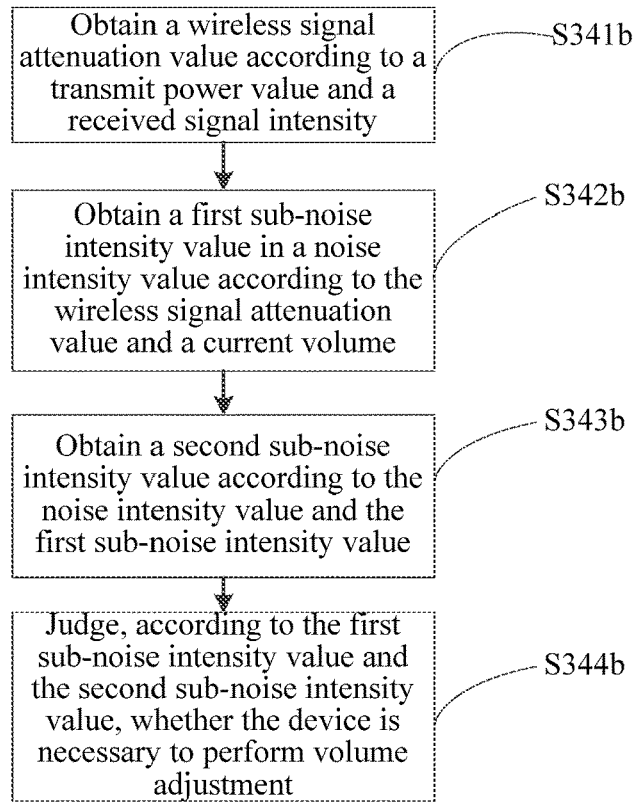
FIG. 6 is an example flowchart of step S341$b$ in an implementation according to an embodiment of the present application.

Specifically, in an example implementation, referring to FIG. 6, the step S340b may include:

S341b: obtaining a wireless signal attenuation value according to the transmit power value and the received signal intensity;

S342b: obtaining a first sub-noise intensity value in the noise intensity value according to the wireless signal attenuation value and the current volume;

S343b: obtaining a second sub-noise intensity value according to the noise intensity value and the first sub-noise intensity value; and S344b: judging, according to the first sub-noise intensity value and the second sub-noise intensity value, whether it is necessary to perform volume adjustment.

In an example implementation, the step S342b may include:

S3421b: determining an intermediate parameter according to the wireless signal attenuation value, where the intermediate parameter may be a parameter capable of associating the wireless signal attenuation value and a sound signal attenuation value, for example, the intermediate parameter may be a distance; and S3422b: obtaining the first sub-noise intensity value in the noise intensity value according to the intermediate parameter and the current volume.

In an example implementation, the step S344b may include: if the first sub-noise intensity value is greater than the second sub-noise intensity value, judging that the device is necessary to perform volume adjustment.

In the present application, the noise intensity value may include: a noise sound pressure level or a noise signal intensity, which reflects information of intensity of noise at the sender of the noise control message. The first sub-noise intensity value reflects a contribution value of a sound output by a current noise source (that is, a current sounding device) for the noise intensity value; the second sub-noise intensity value reflects a contribution value of a sound output by another noise source (that is, another sounding device) for the noise intensity value. Correspondingly, when the noise intensity value is the noise sound pressure level, the first sub-noise intensity value is a first sub-noise sound pressure level, and the second sub-noise intensity value is a second sub-noise sound pressure level; when the noise intensity value is the noise signal intensity, the first sub-noise intensity value is a first sub-noise signal intensity, and the second sub-noise intensity value is a second sub-noise signal intensity. For the sake of simplicity, the following description is given merely by illustrating the situation where the noise intensity value is the noise sound pressure level.

Suppose that the transmit power value of the noise control message is Lt, the received signal intensity of the noise control message is Lr, the current volume is Lc, the noise sound pressure level is $Lp_0$, and the predetermined threshold is Lp.

The wireless signal attenuation value $Ld_1$ may be obtained according to the step S3411a:

$$Ld_1 = Lt - Lr.$$

For the sake of simplicity, it is considered that attenuation of a wireless signal is merely related to a propagation distance of the signal, and suppose that the propagation distance of the signal and an attenuation value of the wireless signal have a first function relationship therebetween, a distance D between the device and the sender of the noise control message may be obtained according to the step S34121a:

$$D = f_1(Ld_1);$$

where $f_1$ denotes the first function relationship.

For the sake of simplicity, it is considered that attenuation of a sound is merely related to a propagation distance of the sound, and suppose that an attenuation value of the sound and the propagation distance thereof have a second function relationship therebetween, an attenuation value $Ld_2$ of the sound after passing through the distance may be obtained according to the step S34122a:

$$Ld_2 = f_2(D);$$

where $f_2$ denotes the second function relationship.

Further, according to the current volume, the first sub-noise sound pressure level $Lp_1$ may be obtained:

$$Lp_1 = Lc - Ld_2,$$

in the step S3413a, suppose that the second sub-noise sound pressure level is $Lp_2$, there is a formula according to sound intensity superposition:

$$Lp_0 = 10 \times \lg\left(10^{\frac{Lp_1}{10}} + 10^{\frac{Lp_2}{10}}\right);$$

$Lp_2$ may be obtained through calculation according to the formula.

Whether it is necessary to perform volume adjustment may be judged by comparing $Lp_1$ and $Lp_2$.

Figure 7:
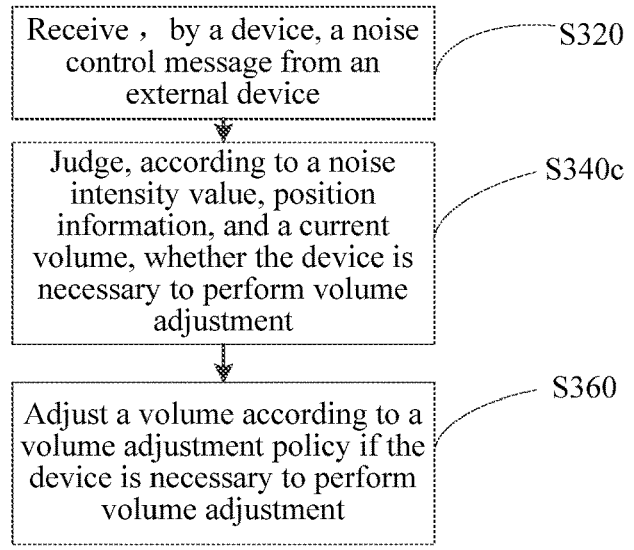
FIG. 7 is an example flowchart of a noise control method in an implementation according to an embodiment of the present application.

In an example implementation, the noise control message includes: a noise intensity value, and position information. The position information is position information of the sender of the noise control message. Moreover, referring to FIG. 7, the step S340 includes:

S340c: judging, according to the noise intensity value, the position information and current volume, whether the device is necessary to perform volume adjustment.

Figure 8:
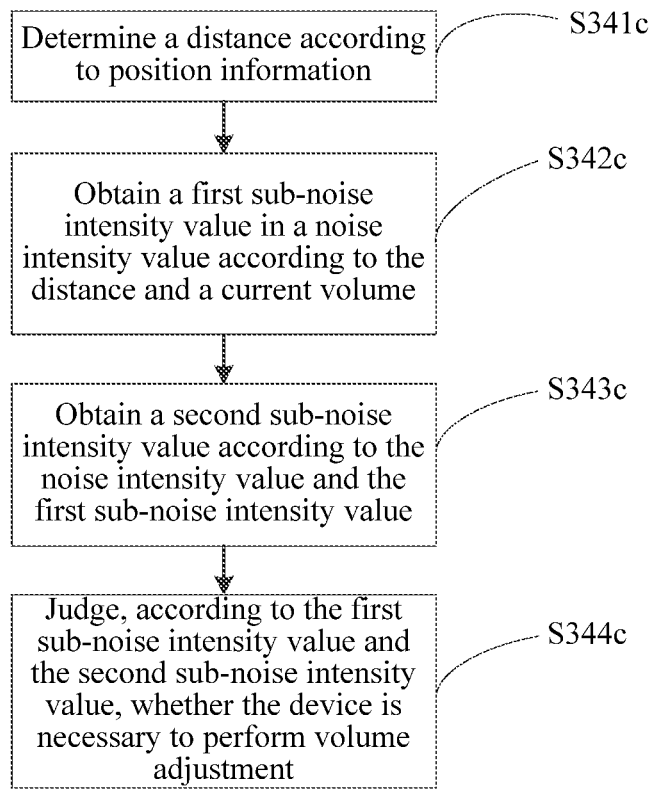
FIG. 8 is an example flowchart of step S341$c$ in an implementation according to an embodiment of the present application.

Specifically, referring to FIG. 8, in an example implementation, the step S340c may include:

S341c: determining a distance according to the position information;

S342c: mobtaining the first sub-noise intensity value in the noise intensity value according to the distance and the current volume;

S343c: obtaining a second sub-noise intensity value according to the noise intensity value and the first sub-noise intensity value; and S344c: judging, according to the first sub-noise intensity value and the second sub-noise intensity value, whether the device is necessary to perform volume adjustment.

In the step S341c, the distance is a distance from a current sounding source to the sender of the noise control message. The current sounding source may acquire its own position information through indoor positioning or other technologies, and a distance from the current sounding source to the sender of the noise control message may be obtained in combination with position information of the sender of the noise control message.

The example implementation process of the steps S342c-S344c is similar to that of the steps S342b, S343b and S344b in the previous example implementation, which is not repeated herein.

Figure 9:
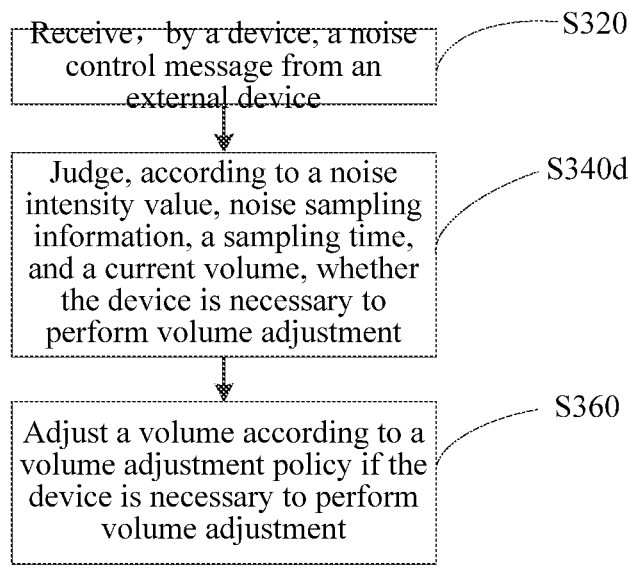
FIG. 9 is an example flowchart of a noise control method in an implementation according to an embodiment of the present application.

In an example implementation, the noise control message includes: a noise intensity value, noise sampling information and a corresponding sampling time. Moreover, referring to FIG. 9, the step S340 includes:

S340d: judging, according to the noise intensity value, the noise sampling information, the sampling time and a current volume, whether the device is necessary to perform volume adjustment.

Figure 10:
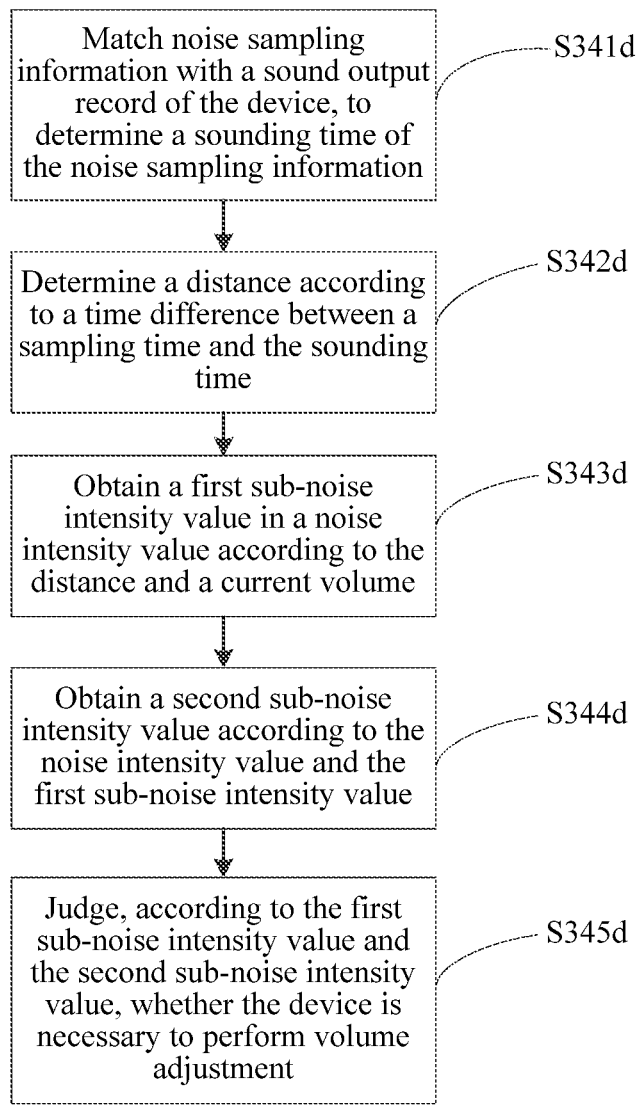
FIG. 10 is an example flowchart of step S340$d$ in an implementation according to an embodiment of the present application.

Specifically, in an example implementation, referring to FIG. 10, the step S340d may include:

S341d: matching the noise sampling information with a sound output record of the device, to determine a sounding time of the noise sampling information;

S342d: determining a distance according to a time difference between the sampling time and the sounding time;

S343d: obtaining a first sub-noise intensity value in the noise intensity value according to the distance and the current volume;

S344d: obtaining a second sub-noise intensity value according to the noise intensity value and the first sub-noise intensity value; and S345d: judging, according to the first sub-noise intensity value and the second sub-noise intensity value, whether the device is necessary to perform volume adjustment.

In the step S341d, the noise sampling information may be a recording of ambient noise, that is, a noise sampling fragment, and may also be a noise sampling feature (such as a spectral feature) obtained through extraction after processing on the noise sampling fragment. For the sake of simplicity, the following description about the step S341d is merely based on the situation where the noise sampling information is a noise sampling fragment (when the noise sampling information is a noise sampling feature, the following steps a and b may be omitted during processing on the noise sampling information).

In an example implementation, the step S341d may include:

a) dividing an audio signal to be processed into a plurality of frames;

b) extracting features of audio signals of each frame, the features include, but are not limited to, Fourier coefficients, Mel-frequency Cepstral Coefficients (MFCCs), spectral flatness, spectral sharpness, Linear Predictive Coding coefficients and the like;

c) compressing the extracted features by using a classification algorithm, to form a sub-fingerprint corresponding to each frame;

d) taking the noise sampling information as the audio signal to be processed to execute the steps a-c, to obtain a plurality of sub-fingerprints corresponding to the noise sampling information, the plurality of sub-fingerprints forming a fingerprint block; and taking a sound output of the device as the audio signal to be processed to execute the steps a-c, to obtain a plurality of sub-fingerprints corresponding to the sound output, the plurality of sub-fingerprints forming a fingerprint stream; and e) comparing similarity between different parts of the fingerprint block and the fingerprint stream, so as to judge whether they match each other; when the similarity is greater than a predetermined value, it may be considered that they match each other, and a sounding time of the noise sampling information may be obtained in the case that they match each other.

Reference may be made to Jaap Haitsma and Antonius Kalker et al.'s Paper "A Highly Robust Audio Fingerprinting System", International Symposium on Music Information Retrieval (ISMIR) 2002, pp. 107-115, for example implementation of the steps a-e. This is not the focus of the present application, and is not repeated herein.

In the step S342d, the distance is a distance from a current sounding source to the sender of the noise control message. A time difference may be obtained according to the sampling time and the sounding time, and then a distance from the current sounding source to the sender of the noise control message may be obtained in combination with a propagation speed of the sound in the air.

The example implementation process of the steps S343d-S345d is similar to that of the steps S342c-S344c in the previous example implementation, which is not repeated herein.

In the example implementation, after the first sub-noise intensity value and the second sub-noise intensity value are determined, the adjusting a volume according to a volume adjustment policy may include:

361: determining a target volume according to the first sub-noise intensity value, the second sub-noise intensity value, the current volume and a predetermined threshold; and 362: adjusting the volume according to the target volume.

The predetermined threshold reflects the user's tolerability for the noise, and may be preset by the user or a manufacturer.

In the step 361, first suppose that other noise sources may not adjust the volume and also suppose that the first sub-noise sound pressure level after adjustment of the volume is $Lp_{1'}$, according to the predetermined threshold Lp and the second sub-noise sound pressure level $Lp_2$, there is a formula according to sound intensity superposition:

$$Lp = 10 \times \lg\left(10^{\frac{Lp_1'}{10}} + 10^{\frac{Lp_2}{10}}\right);$$

$Lp_{1'}$ may be obtained through calculation according to the formula.

Further, the target volume La may be obtained according to the current volume Lc and the first sub-noise sound pressure levels $Lp_1$ and $Lp_{1'}$ before and after adjustment of the volume:

$$La = Lc - (Lp_1 - Lp_{1'}).$$

Those skilled in the art should understand that, in the step 361, in determination of the target volume, it may also be assumed that the other noise sources may adjust the volume, for example, it may be assumed that the second sub-noise sound pressure level of the other noise sources after adjustment is $Lp_{2'} = Lp_2 \times 50\%$.

In an example implementation, the adjusting a volume according to a volume adjustment policy may include:

adjusting the volume according to a step length.

In order to better implement the method in the example implementation, the method in the example implementation may be executed cyclically, that is, each time the noise control message is received, adjustment of the volume is executed once, until the noise control message is no longer received. The step length may be a fixed value, and may also be a non-fixed value. The step length may be set with reference to the current volume, for example, when the current volume is great, a large step length is set, and when the current volume is small, a small step length is set.

For example, when the noise control message is received for the first time, the current volume is 80 dB, the step length is determined to be −20 dB, and the adjusted volume is 60 dB; when the noise control message is received for the second time, the current volume is 60 dB, the step length is determined to be −8 dB, and the adjusted volume is 52 dB; when the noise control message is received for the third time, the current volume is 52 dB, the step length is determined to be −5 dB, and the adjusted volume is 47 dB.

In an example implementation, the adjusting a volume according to a volume adjustment policy may include:

controlling the volume to be within a volume interval.

In the example implementation, reference may be made to a predetermined proportion of the current volume for determination of the volume interval, for example, an upper limit of the volume interval may be set to be 50% of the current volume, a lower limit is set to 0, and suppose that the current volume is 80 dB, the determined volume interval is [40, 0].

According to the method in the example implementation, merely output volume of an audio signal beyond a volume interval may be adjusted, so as to avoid the situation where the output volume of a part with a smaller volume value in the audio signal is 0 after adjustment to result in that other uses cannot hear totally.

Figure 11:
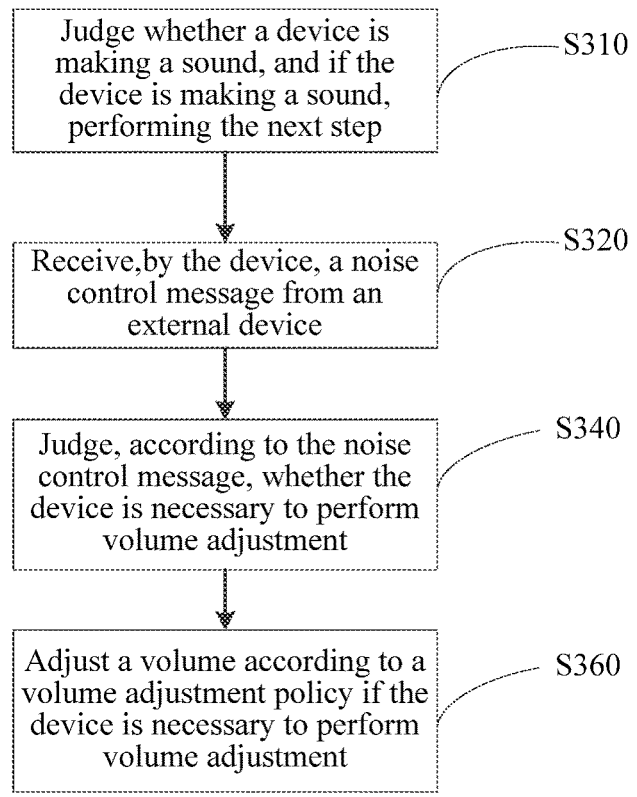
FIG. 11 is an example flowchart of a noise control method in an implementation according to an embodiment of the present application.

In consideration of demands for saving energy, the method does not need to be executed all the time after a device has been turned on, but only needs to be executed when the device is in a sounding state. Therefore, referring to FIG. 11, in another example implementation of the present application, the method further includes:

S310: judging whether the device itself is making a sound, and if the device is making a sound, performing the step of receiving a noise control message from the external.

In addition, the embodiments of the present application also provide a computer readable medium, comprising computer readable instructions which perform the following operations when being executed: executing the operations of steps S320, S340 and S360 of the method in the example implementation shown in FIG. 3.

To sum up, according to the noise control method in this embodiment, after a noise control message is received, whether it is necessary to perform volume adjustment may be judged according to related information in the message, and when it is necessary to perform volume adjustment, corresponding volume adjustment may be performed according to a target volume, a step length or a volume interval, so as to easily and quickly realize control over ambient noise, thereby improving user experience.

Figure 12:
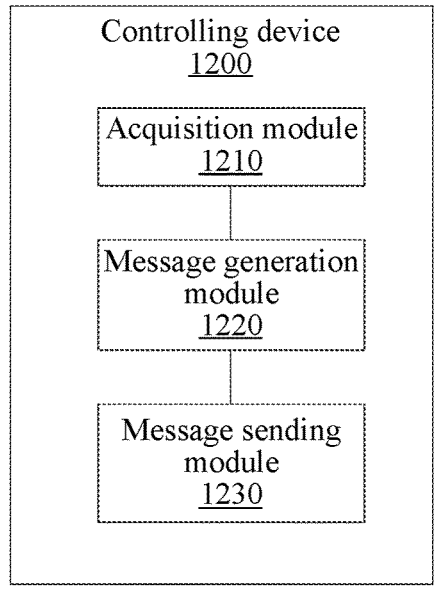
FIG. 12 is an example schematic diagram of a modular structure of a noise controlling device according to an embodiment of the present application.

FIG. 12 is a schematic diagram of a modular structure of a noise controlling device according to an embodiment of the present application. The noise controlling device may generally be a device carried by a user, for example, a smart phone, a smart watch, smart glasses, a smart ring or other devices. The devices are carried by the user, noise information acquired by the devices is closer to noise that the user feels with ears.

As shown in FIG. 12, the controlling device 1200 includes:

an acquisition module 1210, configured to acquire noise information of an ambient environment;

a message generation module 1220, configured to generate a noise control message including the noise information, the noise control message being used to notify other devices to adjust a volume; and a message sending module 1230, configured to send the noise control message to the other devices.

Figure 13:
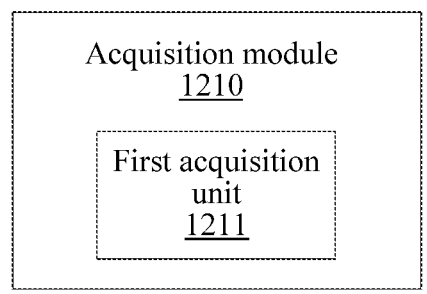
FIG. 13 is an example schematic diagram of a modular structure of an acquisition module in an implementation according to an embodiment of the present application.

Referring to FIG. 13, in an example implementation, the noise information includes: a noise intensity value. The noise intensity value refers to information that may reflect intensity of noise in an ambient environment, for example, it may be a noise sound pressure level, a noise signal intensity or the like. In the example implementation, the acquisition module 1210 includes:

a first acquisition unit 1211, configured to acquire a noise intensity value of the ambient environment.

In an example implementation, the noise control message may include: the noise intensity value, and a transmit power value of the noise control message.

In an example implementation, the noise control message may include: the noise intensity value, and position information of a sender of the noise control message.

Figure 14:
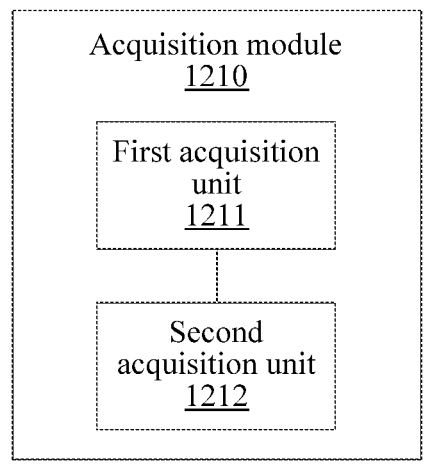
FIG. 14 is an example schematic diagram of a modular structure of an acquisition module in an implementation according to an embodiment of the present application.

In an example implementation, the noise control message may include: the noise intensity value, noise sampling information and a corresponding sampling time. The noise sampling information and the sampling time may be acquired during acquisition of the noise information, that is to say, the noise information acquired from the noise of the ambient environment includes the noise sampling information and the sampling time. Referring to FIG. 14, in the example implementation, the acquisition module 1210 may further include:

a second acquisition unit 1212, configured to acquire noise sampling information and a corresponding sampling time from noise of the ambient environment.

Figure 15:
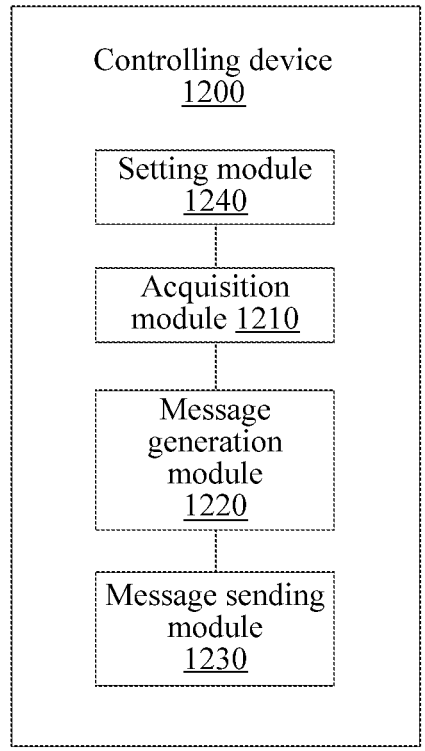
FIG. 15 is an example schematic diagram of a modular structure of a noise controlling device in an implementation according to an embodiment of the present application.

The noise information in the present application may be noise information corresponding to all collected sound frequencies. In addition, in another example implementation, the noise information may also be noise information of some specific sound frequency intervals, that is, noise information of at least one sound frequency interval. Referring to FIG. 15, in the example implementation, the controlling device 1200 may further include:

a setting module 1240, configured to set at least one sound frequency interval according to user input, the noise information being noise information of at least one sound frequency interval.

Figure 16:
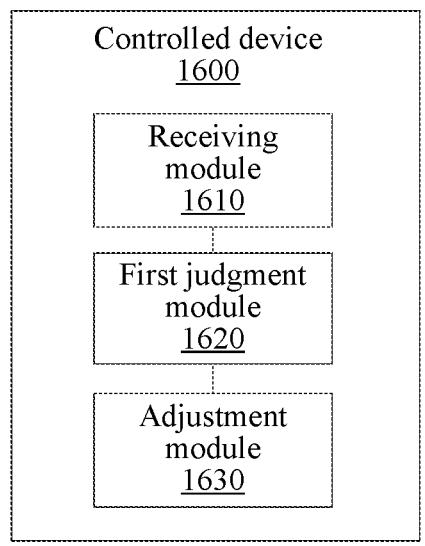
FIG. 16 is an example schematic diagram of a modular structure of a noise controlled device according to an embodiment of the present application.

FIG. 16 is a schematic diagram of a modular structure of a noise controlled device according to an embodiment of the present application; the noise controlled device may be, for example, a TV set, an audio device, a game console, a personal computer, a mobile phone or other devices that may make a loud sound.

Referring to FIG. 16, the controlled device 1600 may include:

a receiving module 1610, configured to receive a noise control message from the external;

a first judgment module 1620, configured to judge, according to the noise control message, whether it is necessary for the controlled device to perform volume adjustment; and an adjustment module 1630, configured to adjust a volume according to a volume adjustment policy if it is necessary to perform volume adjustment.

Figure 17:
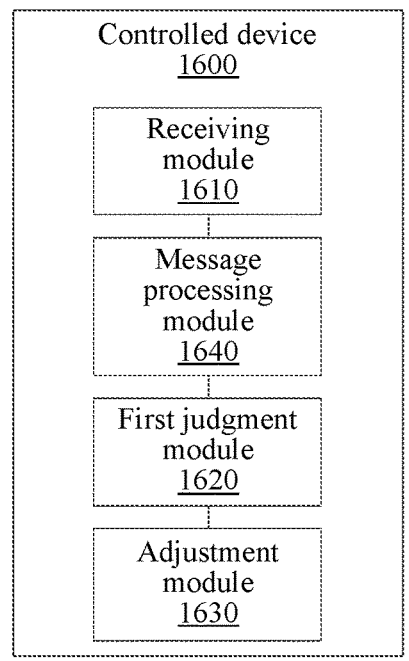
FIG. 17 is an example schematic diagram of a modular structure of a noise controlled device in an implementation according to an embodiment of the present application.

Referring to FIG. 17, in an example implementation, the controlled device 1600 further includes:

a message processing module 1640, configured to extract a noise intensity value from the noise control message.

Correspondingly, the first judgment module 1620 is configured to judge whether the noise intensity value is greater than a predetermined threshold, and if yes, judge that the device is necessary to perform volume adjustment.

The predetermined threshold reflects the user's tolerability for the noise, for example, if the user hopes that the surrounding noise is less than or equal to 10 dB, the predetermined threshold may be set to 10 dB. The predetermined threshold may be set by the user during use, or may be set by a device manufacturer before delivery.

In an example implementation, the message processing module 1640 is configured to extract the noise intensity value and a transmit power value of the noise control message from the noise control message.

Corresponding, the first judgment module 1620 is configured to judge, according to the noise intensity value, the transmit power value, a current volume, and a received signal intensity of the noise control message, whether it is necessary to perform volume adjustment. In the present application, the current volume is the volume before volume adjustment.

Figure 18:
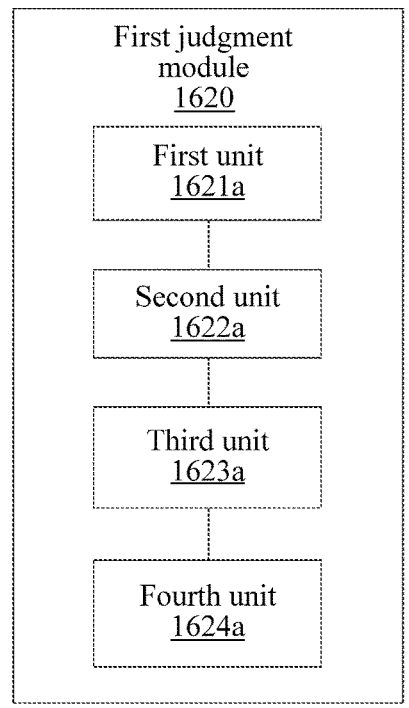
FIG. 18 is an example schematic diagram of a modular structure of a first judgment module in an implementation according to an embodiment of the present application.

Referring to FIG. 18, in the example implementation, the first judgment module 1620 may include:

a first unit 1621a, configured to obtain a wireless signal attenuation value according to the transmit power value and the received signal intensity;

a second unit 1622a, configured to obtain a first sub-noise intensity value in the noise intensity value according to the wireless signal attenuation value and the current volume;

a third unit 1623a, configured to obtain a second sub-noise intensity value according to the noise intensity value and the first sub-noise intensity value; and a fourth unit 1624a, configured to judge, according to the first sub-noise intensity value and the second sub-noise intensity value, whether it is necessary to perform volume adjustment.

Figure 19:
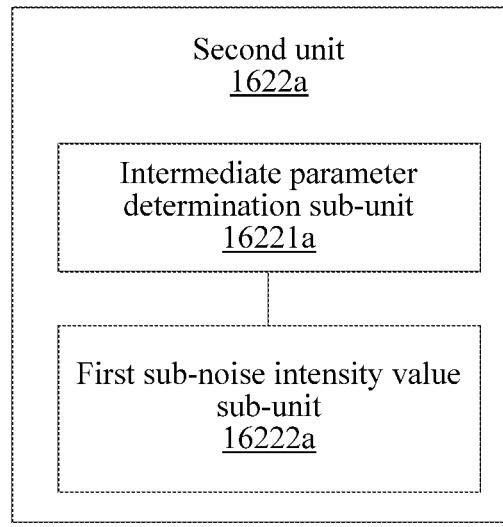
FIG. 19 is an example schematic diagram of a modular structure of a second unit in an implementation according to an embodiment of the present application.

Referring to FIG. 19, the second unit 1622a may include:

an intermediate parameter determination sub-unit 16221a, configured to determine an intermediate parameter according to the wireless signal attenuation value; and a first sub-noise intensity value sub-unit 16222a, configured to obtain the first sub-noise intensity value in the noise intensity value according to the intermediate parameter and the current volume.

In an example implementation, the fourth unit 1624a is configured to judge that the device is necessary to perform volume adjustment if the first sub-noise intensity value is greater than the second sub-noise intensity value.

In an example implementation, the message processing module 1640 is configured to extract position information and the noise intensity value from the noise control message. The position information is position information of the sender of the noise control message.

Correspondingly, the first judgment module 1620 is configured to judge, according to the noise intensity value, the position information and a current volume, whether the device is necessary to perform volume adjustment.

Figure 20:
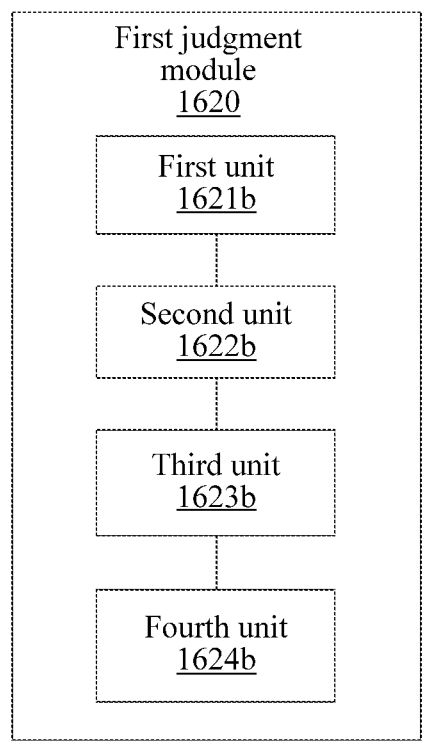
FIG. 20 is an example schematic diagram of a modular structure of a first judgment module in an implementation according to an embodiment of the present application.

Referring to FIG. 20, in the example implementation, the first judgment module 1620 may include:

a first unit 1621b, configured to determine a distance according to the position information;

a second unit 1622b, configured to obtain a first sub-noise intensity value in the noise intensity value according to the distance and the current volume;

a third unit 1623b, configured to obtain a second sub-noise intensity value according to the noise intensity value and the first sub-noise intensity value; and a fourth unit 1624b, configured to judge, according to the first sub-noise intensity value and the second sub-noise intensity value, whether the device is necessary to perform volume adjustment.

In an example implementation, the message processing module 1640 is configured to extract the noise intensity value, noise sampling information and a corresponding sampling time from the noise control message.

Correspondingly, the first judgment module 1620 is configured to judge, according to the noise intensity value, the noise sampling information, the sampling time and a current volume, whether the device is necessary to perform volume adjustment.

Figure 21:
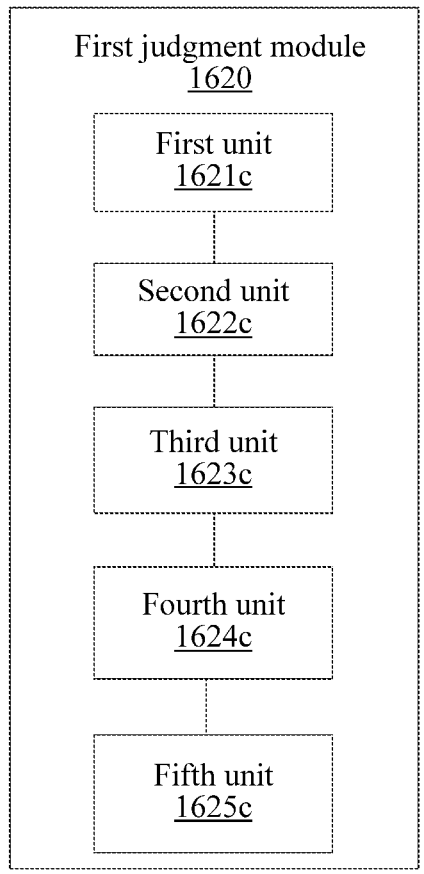
FIG. 21 is an example schematic diagram of a modular structure of a first judgment module in an implementation according to an embodiment of the present application.

Referring to FIG. 21, in the example implementation, the first judgment module 1620 includes:

a first unit 1621c, configured to match the noise sampling information with a sound output record of the device, to determine a sounding time of the noise sampling information;

a second unit 1622c, configured to determine a distance according to a time difference between the sampling time and the sounding time;

a third unit 1623c, configured to obtain a first sub-noise intensity value in the noise intensity value according to the distance and the current volume;

a fourth unit 1624c, configured to obtain a second sub-noise intensity value according to the noise intensity value and the first sub-noise intensity value; and a fifth unit 1625c, configured to judge, according to the first sub-noise intensity value and the second sub-noise intensity value, whether the device is necessary to perform volume adjustment.

Figure 22:
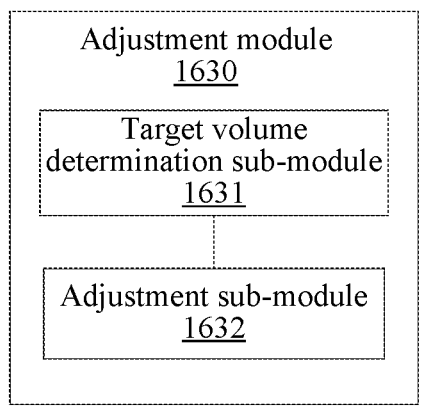
FIG. 22 is an example schematic diagram of a modular structure of an adjustment module in an implementation according to an embodiment of the present application.

Referring to FIG. 22, in an example implementation, after the first sub-noise intensity value and the second sub-noise intensity value are determined, the adjustment module 1630 may include:

a target volume determination sub-module 1631, configured to determine a target volume according to the first sub-noise intensity value, the second sub-noise intensity value, the current volume and a predetermined threshold; and an adjustment sub-module 1632, configured to adjust the volume according to the target volume.

In an example implementation, the adjustment module 1630 is configured to adjust the volume according to a step length.

In an example implementation, the adjustment module 1630 is configured to control the volume to be within a volume interval.

Figure 23:
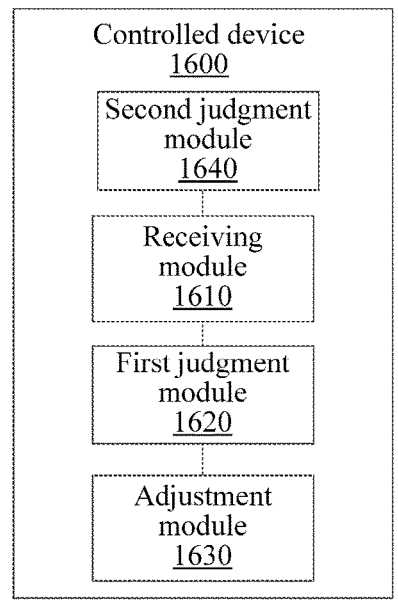
FIG. 23 is an example schematic diagram of a modular structure of a noise controlled device in an implementation according to an embodiment of the present application.

In consideration of demands for saving energy, the device does not need to operate all the time after the device has been turned on, but only needs to operate when the device is in a sounding state. Referring to FIG. 23, in another example implementation, the controlled device 1600 may further include:

a second judgment module 1640, configured to judge whether the device is making a sound, and if it is making a sound, enable the receiving module 1610.

Figure 24:
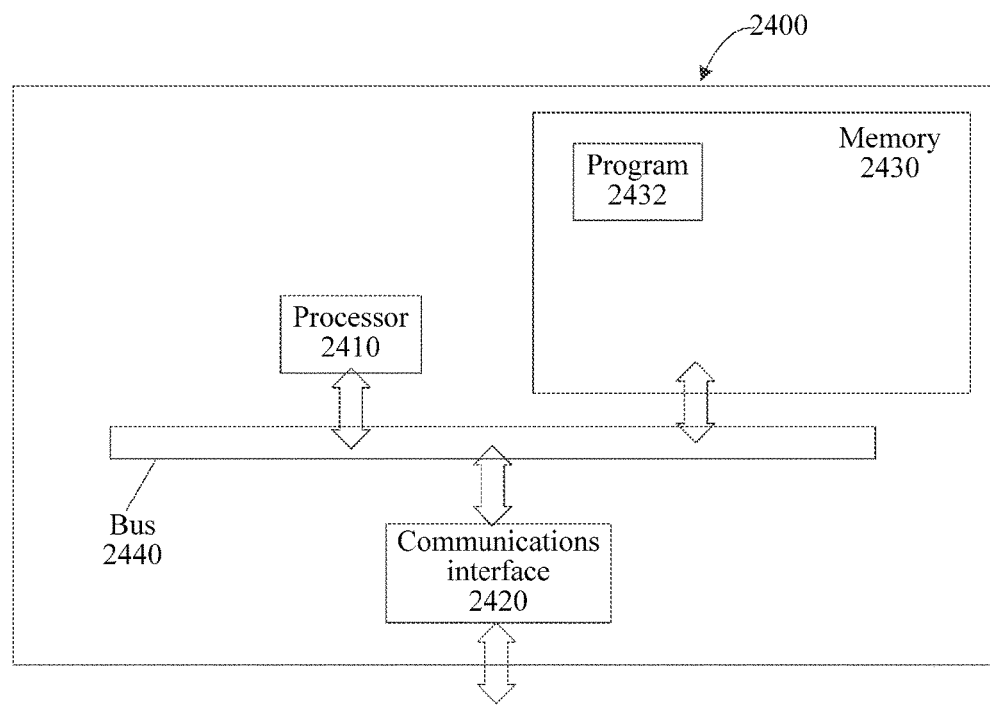
FIG. 24 is an example structural diagram of a noise controlling device according to an embodiment of the present application.

The structure of the noise controlling device according to an embodiment of the present application is as shown in FIG. 24. The specific embodiment of the present application does not limit specific implementation of the noise controlling device; referring to FIG. 24, the noise controlling device 2400 may include:

a processor 2410, a communications interface 2420, a memory 2430, and a communications bus 2440.

The processor 2410, the communications interface 2420, and the memory 2430 complete mutual communications via the communications bus 2440.

The communications interface 2420 is configured to communicate with another network element.

The processor 2410 is configured to execute a program 2432, and may specifically implement relevant steps in the process embodiment shown in FIG. 1 or 2.

Specifically, the program 2432 may include a program code, the program code including a computer operation instruction.

The processor 2410 may be a central processing unit (CPU), or an application specific integrated circuit (ASIC), or be configured to be one or more integrated circuits which implement the embodiments of the present application.

The memory 2430 is configured to store the program 2432. The memory 2430 may include a high-speed RAM memory, and may also include a non-volatile memory, for example, at least one magnetic disk memory. The program 2432 may specifically execute the following steps:

acquiring noise information of an ambient environment;

generating a noise control message including the noise information, the noise control message being used to notify other devices to adjust a volume; and sending the noise control message to the other devices.

Reference may be made to the corresponding steps or modules in the foregoing embodiments for specific implementation of each step in the program 2432, which is not repeated herein. Those skilled in the art may clearly understand that, reference may be made to the corresponding description in the foregoing process embodiments for the particular working procedures of the devices and modules described above, and will not be repeated herein in order to make the description convenient and concise.

Figure 25:
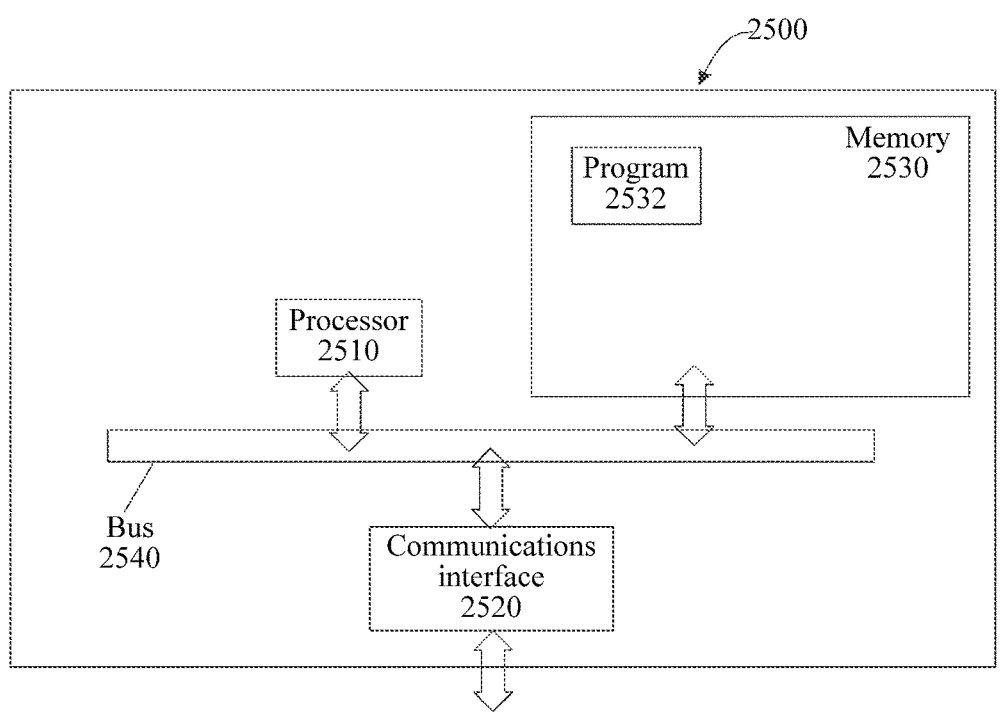
FIG. 25 is an example structural diagram of a noise controlled device according to an embodiment of the present application.

The structure of a noise controlled device according to an embodiment of the present application is as shown in FIG. 25. The specific embodiment of the present application does not limit specific realization of the noise controlled device; referring to FIG. 25, the noise controlled device 2500 may include:

a processor 2510, a communications interface 2520, a memory 2530, and a communications bus 2540.

The processor 2510, the communications interface 2520, and the memory 2530 complete mutual communications via the communications bus 2540.

The communications interface 2520 is configured to communicate with another network element.

The processor 2510 is configured to execute a program 2532, and may specifically implement relevant steps in the process embodiments shown in FIG. 3 to FIG. 11.

Specifically, the program 2532 may include a program code, the program code including a computer operation instruction.

The processor 2510 may be a central processing unit (CPU), or an application specific integrated circuit (ASIC), or be configured to be one or more integrated circuits which implement the embodiments of the present application.

The memory 2530 is configured to store the program 2532. The memory 2530 may include a high-speed RAM memory, and may also include a non-volatile memory, for example, at least one magnetic disk memory. The program 2532 may specifically execute the following steps:

receiving, by the device, a noise control message from an external device;

judging, according to the noise control message, whether the device is necessary to perform volume adjustment; and adjusting the volume according to a volume adjustment policy if the device is necessary to perform volume adjustment.

Reference may be made to the corresponding steps or modules in the foregoing embodiments for specific realization of each step in the program 2532, which is not repeated herein. Those skilled in the art may clearly understand that, reference may be made to the corresponding description in the foregoing process embodiments for the particular working procedures of the devices and modules described above, and will not be repeated herein in order to make the description convenient and concise.

It may be appreciated by those of ordinary skill in the art that each exemplary unit and method step described with reference to the embodiments disclosed herein may be implemented by electronic hardware or a combination of computer software and electronic hardware. Whether these functions are executed in a hardware mode or a software mode depends on particular applications and design constraint conditions of the technical solution. The professional technicians may use different methods to implement the functions described with respect to each particular application, but such implementation should not be considered to go beyond the scope of the present application.

If the functions are implemented in the form of a software functional unit and is sold or used as an independent product, it may be stored in a computer-readable storage medium. Based on such understanding, the technical solution of the present application essentially or the part which contributes to the prior art or a part of the technical solution may be embodied in the form of a software product, and the computer software product is stored in a storage medium, and includes several instructions for enabling a computer device (which may be a personal computer, a controller, a network device, or the like) to execute all or some steps of the method described in each embodiment of the present application. The foregoing storage medium includes various media which may store a program code, such as a USB disk, a mobile hard disk, a read-only memory (ROM), a random access memory (RAM), a magnetic disk, an optical disc, or the like.

The above embodiments are merely used to describe the present application, instead of limiting the present application; various alterations and variants may be made by those of ordinary skill in the art without departing from the spirit and scope of the present application, so all equivalent technical solutions also belong to the scope of the present application, and the scope of patent protection of the present application should be defined by claims.

What is claimed is:

1. A method, comprising:
    obtaining, by a device comprising a processor, user input that defines at least one sound frequency interval;
    acquiring, by the device, noise information of an ambient environment, wherein the noise information is the noise information of the at least one sound frequency interval;
    generating, by the device, a noise control message comprising the noise information, the noise control message being used to notify another device to adjust a volume, wherein the other device is a noise source; and
    sending, by the device, the noise control message to the other device, wherein the noise control message comprises a noise intensity value, noise sampling information, and a corresponding sampling time.

2. The method according to claim 1, wherein the noise control message further comprises: a transmit power value of the noise control message.

3. The method according to claim 1, wherein the noise sampling information comprises: a noise sampling fragment or a noise sampling feature.

4. The method according to claim 1, wherein the noise control message further comprises: position information.

5. The method according to claim 1, wherein the noise intensity value is a noise sound pressure level or a noise signal intensity.

6. The method according to claim 1, wherein the sending the noise control message to the other device comprises:
    sending the noise control message to the other device through broadcasting.

7. The method of claim 1, wherein the generating a noise control message comprises generating the noise control message comprising a transmit power value to facilitate determining, by the other device, a wireless signal attenuation value based on the transmit power value and a received signal intensity.

8. The method of claim 7, wherein the noise intensity value facilitates determining, by the other device, a first sub-noise intensity value based on the wireless signal attenuation value and a current volume.

9. The method of claim 1, wherein the noise control message facilitates determining, by the other device, a distance value based on the corresponding sampling time and a sounding time.

10. The method according to claim 1, wherein the noise control message further comprises position information of the device.

11. A device, comprising:
    a processor, communicatively coupled to a memory that stores computer-executable instructions, that executes the computer-executable instructions to perform operations comprising:
        obtain user input that defines at least one sound frequency interval;

acquire noise information of at least one sound frequency interval of an ambient environment, where the noise information comprises a noise intensity value of the ambient environment, and noise sampling information and a corresponding sampling time from noise of the ambient environment;

generate a noise control message comprising the noise information, the noise control message being used to notify other devices to adjust a volume, wherein the other devices are noise sources; and send the noise control message to the other devices.

12. The device of claim 11, wherein the noise control message comprises a transmit power value of the noise control message.

13. The device of claim 11, wherein the noise control message further comprises position information.

14. The device of claim 11, wherein the noise sampling information comprises a noise sampling fragment.

15. The device of claim 11, wherein the noise sampling information comprises a noise sampling feature.

16. The device of claim 11, wherein the noise intensity value is a noise sound pressure level.

17. The device of claim 11, wherein the noise intensity value is a noise signal intensity.

18. The device of claim 11, wherein the operations further comprise send the noise control message to the other device via an over the air interface.

19. The device of claim 11, wherein the operations further comprise the noise control message comprises a transmit power to facilitate determination, by the other devices, of a wireless signal attenuation value based on the transmit power value and a received signal intensity.

20. The device of claim 19, wherein the noise intensity value facilitates determining, by the other devices, a first sub-noise intensity value based on the wireless signal attenuation value and a current volume.

21. The device of claim 20, wherein the noise intensity value facilitates determining, by the other devices, a second sub-noise intensity value based on the wireless signal attenuation value and the first sub-noise intensity value.

22. The device of claim 11, wherein the operations further comprise generation of the noise control message facilitates determination, by the other devices, of a distance value based on the corresponding sampling time and a sounding time.

23. The device of claim 11, wherein the noise control message further comprises position information of the device.

24. The device of claim 11, wherein the device is a smart phone.

25. The device of claim 11, wherein the device is a smart watch.

26. The device of claim 11, wherein the device is a smart glasses.

27. The device of claim 11, wherein the device is a smart ring.

28. The device of claim 11, wherein the device is a mobile device.

29. A computer readable storage device, comprising at least one executable instruction, which, in response to execution, causes a noise controlling device comprising a processor to perform operations, comprising:

obtaining user input that defines at least one sound frequency interval;

acquiring noise information of an ambient environment, wherein the noise information is the noise information of the at least one sound frequency interval;

generating a noise control message comprising the noise information, the noise control message being used to notify another device to adjust a volume, wherein the other device is a noise source; and sending the noise control message to the other device, wherein the noise control message comprises a noise intensity value, noise sampling information and a corresponding sampling time.

30. The computer readable storage device of claim 29, wherein the generating the noise control message comprises generating the noise control message comprising a transmit power value of the noise control message.

31. The computer readable storage device of claim 29, wherein the generating the noise control message comprises generating the noise control message comprising position information.

32. The computer readable storage device of claim 29, wherein the noise sampling information comprises a noise sampling fragment.

33. The computer readable storage device of claim 29, wherein the noise sampling information comprises a noise sampling feature.

34. The computer readable storage device of claim 29, wherein the noise intensity value is a noise sound pressure level.

35. The computer readable storage device of claim 29, wherein the noise intensity value is a noise signal intensity.

36. The computer readable storage device of claim 29, wherein the message sending module sends the noise control message to the other device via an over the air interface.

37. The computer readable storage device of claim 29, wherein the noise control message further comprises position information of the noise controlling device.

38. A noise controlling device, comprising a processor and a memory, the memory storing computer executable instructions, the processor being connected to the memory through a communication bus, and when the noise controlling device operates, the processor executes the computer executable instructions stored in the memory, so that the noise controlling device performs operations, comprising:

obtaining user input that defines at least one sound frequency interval;

acquiring noise information of an ambient environment, wherein the noise information is the noise information of the at least one sound frequency interval;

generating a noise control message comprising the noise information, the noise control message being used to notify other devices to adjust a volume, wherein the other devices are noise sources; and sending the noise control message to the other devices, wherein the noise control message comprises a noise intensity value, noise sampling information, and a corresponding sampling time.

39. The noise controlling device of claim 38, wherein the generating the noise control message comprises generating the noise control message comprising a transmit power value of the noise control message.

40. The noise controlling device of claim 38, wherein the generating the noise control message comprises generating the noise control message comprising position information.

41. The noise controlling device of claim 38, wherein the noise sampling information comprises a noise sampling fragment.

42. The noise controlling device of claim 41, wherein the noise intensity value facilitates determining, by the other devices, a second sub-noise intensity value based on a wireless signal attenuation value and a first sub-noise intensity value.

43. The noise controlling device of claim 38, wherein the noise sampling information comprises a noise sampling feature.

44. The noise controlling device of claim 38, wherein the noise intensity value is a noise sound pressure level.

45. The noise controlling device of claim 38, wherein the noise intensity value is a noise signal intensity.

46. The noise controlling device of claim 38, wherein the sending the noise control message to the other device is via wireless interface.

47. The noise controlling device of claim 38, wherein the noise control message further comprises position information of the noise controlling device.

* * * * *